US 6,607,956 B2

(12) United States Patent
Ahn et al.

(10) Patent No.: US 6,607,956 B2
(45) Date of Patent: *Aug. 19, 2003

(54) METHOD OF MANUFACTURING A SINGLE ELECTRON RESISTOR MEMORY DEVICE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/123,579

(22) Filed: Apr. 15, 2002

(65) Prior Publication Data

US 2002/0151172 A1 Oct. 17, 2002

Related U.S. Application Data

(62) Division of application No. 09/944,259, filed on Aug. 29, 2001, which is a division of application No. 09/703,364, filed on Oct. 31, 2000, which is a continuation of application No. 09/141,767, filed on Aug. 27, 1998, now Pat. No. 6,141,260.

(51) Int. Cl.[7] ............................................. H01L 21/336
(52) U.S. Cl. ..................... 438/263; 438/264; 438/266; 438/257; 365/189.07; 365/222; 365/230.03
(58) Field of Search ................................ 438/257, 283, 438/694, 737, 197; 257/14, 17, 20, 26, 30, 31, 40, 192, 321, 247, 402

(56) References Cited

U.S. PATENT DOCUMENTS

| 5,323,344 A | 6/1994 | Katayama et al. .......... 365/162 |
| 5,485,595 A | 1/1996 | Assar et al. ................ 395/430 |
| 5,621,687 A | 4/1997 | Doller ..................... 365/185.29 |
| 5,681,770 A | 10/1997 | Ogura et al. ................... 437/43 |
| 5,708,605 A | 1/1998 | Sato ...................... 365/185.29 |
| 5,731,598 A | 3/1998 | Kado et al. .................... 257/30 |
| 5,740,104 A | 4/1998 | Forbes .................. 365/185.03 |
| 5,754,477 A | 5/1998 | Forbes .................. 365/185.03 |
| 5,952,692 A | 9/1999 | Nakazato et al. ........... 257/321 |
| 6,121,157 A | 9/2000 | Nakajima .................... 438/737 |
| 6,222,778 B1 | 4/2001 | Ahn et al. ............. 365/189.07 |
| 6,301,162 B1 * | 10/2001 | Ahn et al. ............. 365/189.07 |

OTHER PUBLICATIONS

Lingjie Guo et al., "A room–temperature silicon single–electron metal–oxide–semiconductor memory with nanoscale floating–gate and ultranarrow channel," *Apply. Phys. Lett.* 70(7):850–852, Feb. 1997.

Lingjie Guo et al., "Fabrication and characterization of room temperature silicon single electron memory," *J. Vac. Sci. Technol. B* 15(6):2840–2843, Nov./Dec. 1997.

Rodrigo Martins et al., "Transport properties of doped silicon oxycarbide microcrystalline films produced by spatial separation techniques," *Solar Energy Materials and Solar Cells* 41/42:493–517, 1996.

Anri Nakajima et al., "Room Temperature Operation of Si Single–Electron Memory with Self–Aligned Floating Dot Gate," *IEDM 96*, pp. 952–954, 1996.

(List continued on next page.)

Primary Examiner—David Nelms
Assistant Examiner—Dung Anh Le
(74) Attorney, Agent, or Firm—Dorsey & Whitney LLP

(57) ABSTRACT

A method of manufacturing a memory device that includes a plurality of cells, each having a first electrode coupled to a first location on semiconductor material, a second electrode coupled to a second location disposed away from the first location on the semiconductor material and a plurality of islands of semiconductor material. The islands are surrounded by an insulator. The islands and the surrounding insulator are formed in pores extending into the semiconductor material between the first and second electrodes. As a result, the memory cells are able to provide consistent, externally observable changes in response to the presence or absence of a single electron on the island.

3 Claims, 12 Drawing Sheets

OTHER PUBLICATIONS

Anri Nakajima et al., "Room Temperature Operation of Si Single–Electron Memory with Self–Aligned Floating Dot Gate," *Appl. Phys. Lett. (70)13*:1742–1744, Mar. 1997.

Anri Nakajima et al., "Si single electron tunneling transistor with nanoscale floating dot stacked on a Coulomb island by self–aligned process," *Appl. Phys. Lett. 71(3)*:353–355, Jul. 1997.

Sandip Tiwari et al., "Single charge and confinement effects in nano–crystal memories," *Appl. Phys. Lett. 69(9)*:1232–1234, Aug. 1996.

Hussein I. Hanafi., "Fast and Long Retention–Time Nano–Crystal Memory," *IEEE Transactions on Electron Devices 43(9)*:1553–1558, Sep. 1996.

G. Craciun et al., "On the morphology of porous silicon layers obtained by electrochemical method," *1995 International Semiconductor Conference*, 18$^{th}$ Edition, pp. 331–334, Oct. 1995.

Tomoyuki Ishii et al., "A 3–D Single–Electron–Memory Cell Structure with 2F$^2$ per bit," *IEDM*, pp. 924–926, 1997.

K. Yano et al., "Single–Electron–Memory Integrated Circuit for Giga–to–Tera Bit Storage," *ISSCC Digest of Technical Papers*, pp. 266–267, Feb. 1996.

K. Yano et al., "A 128Mb Early Prototype for Gigascale Single–Electron Memories," *ISSCC Digest of Technical Papers*, pp. 344–345., Feb. 1998.

Haroon Ahmed and Kazuo Nakazato, "Single–electron devices," *Microelectronic Engineering 32*:297–315, 1996.

Haroon Ahmed, "Single electron electronics: Challenge for nanofabrication," *J. Vac. Sci. Technol. B. 15(6)*:2101–2108, Nov./Dec. 1997.

Tomoyuki Ishii, "Verify: Key to the Stable Single–Electron-Memory Operation," *IEDM*, pp. 171–174, 1997.

Valery M. Dubin, "Formation mechanism of porous silicon layers obtained by anodization of monocrystalline n–type silicon in HF solutions," *Surface Science 274*:82–92, 1992.

Jian–Shing Luo and Wen–Tai Lin, "Localized epitaxial growth of hexagonal and cubic SiC films on Si by vacuum annealing," *Appl. Phys. Lett. 69(7)*:916–918, Aug. 1996.

Donato Montanari et al., "Novel Level–Identifying Circuit for Flash Multilevel Memories," *IEEE Journal of SolidState Circuits 35(7)*:1090–1095, Jul. 1998.

Nae–In Lee et al., "Highly Reliable Polysilicon Oxide Grown by Electron Cyclotron Resonance Nitrous Oxide Plasma," *IEEE Electron Device Letters 18(10)*:486–488, Oct. 1997.

Masato Tarakomori and Hideaki Ikoma, "Low–Temperature Si Oxidation Using Inductively Coupled Oxygen–Argon Mixed Plasma," *Jpn. J. Appl. Phys. 36*:5409–5415, 1997.

Jin–Woo Lee et al., "Oxidation of Silicon Using Electron Cyclotron Resonance Nitrous Oxide Plasma and Its Application to Polycrystalline Silicon Thin Film Transistors," *Journal of the Electrochemical Society 144(9)*:3283–3287, Sep. 1997.

W.S. Park et al., "Growth of polycrystalline silicon at low temperature on hydrogenated microcrystalline silicon seed layer," *Mat. Res. Soc. Symp. Proc. 467*:403–408, 1997.

T. Nishimiya et al., "Novel Plasma Control Method in PECVD for Preparing Microcrystalline Silicon," *Mat. Res. Soc. Symp. Proc. 467*:397–401, 1997.

Constantin Papadas et al., "Modeling of the Intrinsic Retention Characteristics of Flotox EEPROM Cells Under Elevated Temperature Conditions," *IEEE Transactions on Electron Devices 42(4)*:678–682, Apr. 1995.

Brian Dipert and Lou Hebert, "Flash memory goes mainstream," *IEEE Spectrum*, pp. 48–52, Oct. 1993.

Joao Pedro Conde et al., "Amorphous and Microcrystalline Silicon Deposited by Low–Power Electron–Cyclotron Resonance Plasma–Enhanced Chemical–Vapor Deposition," *Japanese Journal of Applied Physics 36*:38–49, Jan. 1997.

D.M. Wolfe et al., "Low–Temperature (450° C.) Poly–Sci Thin Film Deposition on SiO$_2$ and Glass Using a Microcrystalline–Si Seed Layer," *Mat. Res. Soc. Symp. Proc. 472*:427–432, 1997.

Yasuo Tarui, "Flash Memory Features Simple Structure, Superior Integration," *JEE 30*:84–87, Sep. 1993.

* cited by examiner

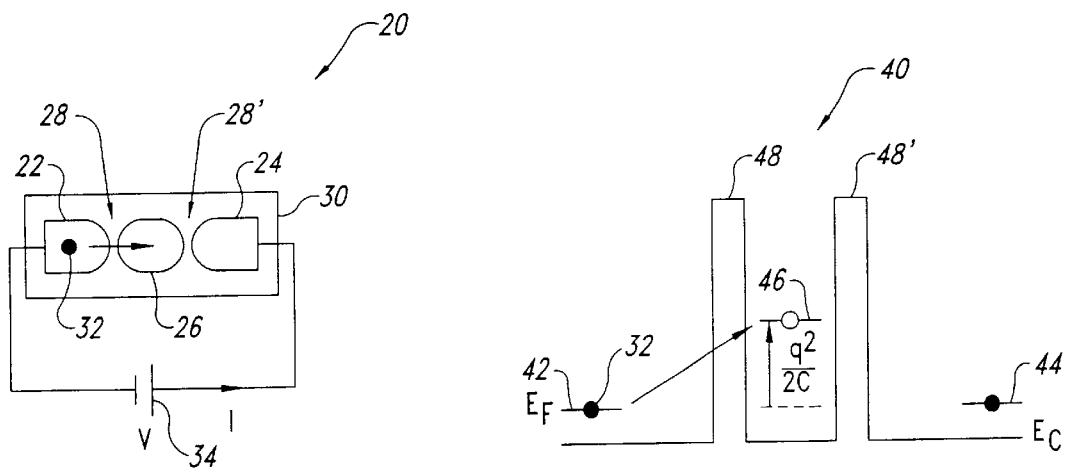
Fig. 1A
(PRIOR ART)
Fig. 1B
(PRIOR ART)
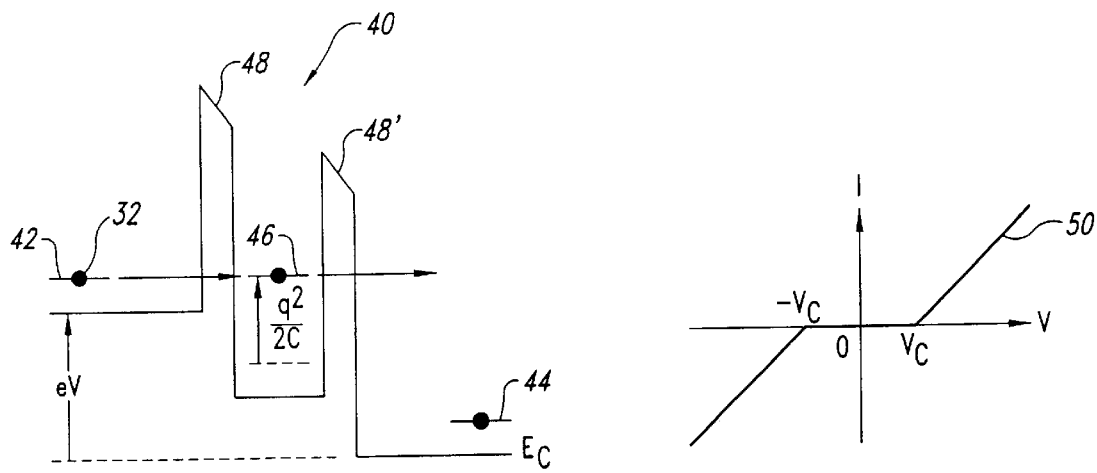
Fig. 1C
(PRIOR ART)
Fig. 1D
(PRIOR ART)

METHOD OF MANUFACTURING A SINGLE ELECTRON RESISTOR MEMORY DEVICE

CROSS-REFERENCE TO RELATED APPLICATIONS

This application is a divisional of pending U.S. patent application Ser. No. 09/944,259, filed Aug. 29, 2001, which is a divisional of pending U.S. patent application Ser. No. 09/703,364, filed Oct. 31, 2000, which is a continuation of U.S. patent application Ser. No. 09/141,767, filed Aug. 27, 1998, issued Oct. 31, 2000 as U.S. Pat. No. 6,141,260.

TECHNICAL FIELD

This invention relates to integrated circuit memory devices, and, more particularly, to a method and apparatus for providing high density, high storage capacity, low power, nonvolatile memory devices.

BACKGROUND OF THE INVENTION

Single electron devices, and particularly single electron memory cells, are presently of great interest, due to potential advantages in memory cell size and power dissipation, compared to memory technologies currently in use. As used herein, the term "single electron device" refers to an electronic device capable of providing a repeatable and measurable response to the presence or absence of a single electron.

As device sizes have shrunk over the last several decades, the number of electrons contributing to the drain current in field effect transistors ("FETs") used in memory devices has correspondingly decreased. Extrapolation from these trends suggests that in another decade, FETs will have drain currents including as few as ten electrons at a time. When so few electrons contribute to a current and therefore to a signal, normal fluctuations in the number of electrons present in a volume of semiconductor material can lead to uncertainty or error in the signal that the current represents.

Memories using single electron memory cells provide certainty in numbers of electrons representing data in a memory cell and therefore help to avoid problems due to fluctuations in the number of electrons that are present in a transistor at one time. Memory cells employing single electron transistors are also extremely simple and can be quite small. For example, a memory structure employing vertically stacked cells to provide an area per bit of 0.145 squared is described in "A 3-D Single-Electron-Memory Cell Structure with 2F² per bit" by T. Ishii et al. (IEDM 97), pp. 924–926.

The combination of size, power requirements and simplicity make single electron structures promising candidates for very high capacity memory integrated circuits. This is discussed in more detail in "Single-Electron-Memory Integrated Circuit for Giga-to-Tera Bit Storage" by K. Yano et al., 1996 Intl. Solid State Circuits Conf. (Feb. 9, 1996), pp. 266–267 and "A 128 Mb Early Prototype for Gigascale Single-Electron Memories" by K. Yano et al., 1998 Intl. Solid State Circuits Conf. (Feb. 7, 1998), pp. 344–345.

FIG. 1A is a simplified schematic diagram of a typical two-terminal single electron device 20, in accordance with the prior art. The single electron device 20 includes first 22 and second 24 electrodes and an island 26 formed from conductive material, which may be semiconductor material, as discussed in U.S. Pat. No. 5,731,598, entitled "Single Electron Tunnel Device And Method For Fabricating The Same" issued to H. Kado et al. (Mar. 24, 1998). The first 22 and second 24 electrodes are each separated from the island 26 by small insulating gaps 28, 28'. The first 22 and second 24 electrodes, the island 26 and the gaps 28, 28' are all collectively mounted on an insulating substrate 30 or are surrounded by an insulator. The gaps 28, 28' may be formed of any insulating material but must be small enough to allow conduction band electrons 32 (hereinafter "electrons") to tunnel through them in response to a voltage V coupled across the first 22 and second 24 electrodes. The voltage V is provided by an external source, represented in FIG. 1A by a battery 34.

A first condition for trapping one or more electrons 32 on the island 26 is that the resistance R between the island 26 and other structures on the substrate 30 must be greater than a quantum resistance $R_k$, as is discussed, for example, in "Single-electron devices" by H. Ahmed et al., Microelectronic Engineering 32 (1996), pp. 297–315, and "Single electron electronics: Challenge for nanofabrication" by H. AhIned, J. Vac. Sci. Technol. B 15(6) (November/December 1997), pp. 2101–2108. When the first 22 and second 24 electrodes and the island 26 are mounted on the insulating substrate 30 and are surrounded by an insulator such as air, a primary resistance R between the island 26 and any other structure is set by tunneling resistances $R_t$ associated with the gaps 28, 28' separating the island 26 from the first 22 and second 24 electrodes. The quantum resistance $R_k$ equals $h/q^2$, or about 26 kΩ, where h is Planck's constant and q represents the charge of a single electron. This first condition will be satisfied for all of the examples considered herein but is included for completeness sake.

A second condition is that allowed states for these electrons 32 must be separated from a conduction band edge $E_C$ by an "electron charging energy" that is given as $q^2/2C$, where C represents a capacitance of the island 26. In other words, a first electron 32 that is introduced onto the island 26 will occupy an allowed state having a potential energy that is greater than that of the conduction band edge $E_C$ for the material forming the island 26 by $q^2/2C$.

A third condition is that, for the electron or electrons 32 to be trapped on the island 26, the electron charging energy $q^2/2C$ must be substantially greater than an average thermal energy kT, or $q^2/2C>kT$, where k represents Boltzmann's constant and T represents temperature in Kelvin. The capacitance C must be on the order of one attoFarad for electrons 32 to be trapped on the island 26 for any appreciable length of time at room temperature (kT=0.026 eV at room temperature). For example, an island 26 having a capacitance of $10^{-16}$ F is about 100 nanometers in diameter but can only exhibit single-electron effects at temperatures at or below about 4 Kelvin. Islands 26 having diameters of one to five nanometers exhibit significant single-electron effects at room temperature (circa 300 K).

FIG. 1B is a simplified potential energy diagram for the device 20 of FIG. 1A showing a potential well 40, in accordance with the prior art. FIG. 1B shows Fermi levels ("$E_F$") 42, 44 in the first 22 and second 24 electrodes, respectively, a lowest allowed state 46 for one electron 32 in the potential well 40 on the island 26, and energy barriers 48, 48' associated with insulating materials forming the gaps 28, 28', respectively. An important property of the device 20 of FIG. 1A is that no significant current can flow through the device 20 until a magnitude of the potential V due to the external source 34 equals or exceeds the electron charging energy or $V \geq q^2/2C$. FIG. 1C is a simplified potential energy diagram illustrating the potential V setting the Fermi level 42 at the left side of the Figure equal to the lowest allowed state of the potential well 40, i.e., at the onset of conduction, in accordance with the prior art.

FIG. 1D is a simplified graph of an I-V characteristic 50 for the device 20 of FIG. 1A, in accordance with the prior art. The I-V characteristic 50 shows essentially no conduction until the applied voltage V reaches a threshold $V_C$, causing the Fermi level 42 on the electron supply side to be equal to the electron charging energy $q^2/2C$. The region of essentially no conduction is known as the Coulomb blockade region. When the applied voltage V reaches the threshold $V_C$, known as the Coulomb gap voltage, the energy barrier effectively vanishes. Linear I-V dependence is seen in FIG. 1D for voltages having an absolute magnitude exceeding $V_C$.

FIG. 2 is a simplified schematic illustration of a typical field effect transistor ("FET") 60 that includes the island 26 of FIG. 1A for storing one or more electrons 32, in accordance with the prior art. The FET 60 includes all of the elements of the two-terminal device 20 of FIG. 1 and additionally includes a gate 62 having a capacitance $C_G$ and a gate bias supply 64. The gate bias supply 64 includes a first electrode coupled to the gate 62 and a second electrode coupled to one side of the supply 34 providing the voltage V. The FET 60 has a channel 66 formed from semiconductor material that is coupled to the first 22 and second 24 electrodes.

Several examples of FETs 60 capable of providing repeatable output signals indicative of single electron 32 storage on the islands 26 are described in "A Room-Temperature Silicon Single-Electron Metal-Oxide-Semiconductor Memory With Nanoscale Floating-Gate and Ultranarrow Channer" by L. Guo et al., Appl. Phys. Lett. 70(7) (Feb. 17, 1997), pp. 850–852 and "Fabrication And Characterization of Room Temperature Silicon Single Electron Memory" by L. Guo et al., J. Vac. Sci. Technol. B 15(6) (November/December 1997), pp. 2840–2843. Similar FETs 60 are described in "Room Temperature Operation of Si Single-Electron-Memory with Self-Aligned Floating Dot Gate" (IEDM 1996), pp. 952–954, Appl. Phys. Lett. 70(13) (Mar. 31, 1997), pp. 1742–1744 and "Si Single Electron Tunneling Transistor With Nanoscale Floating Dot Stacked on a Coulomb Island by Self-Aligned Process," Appl. Phys. Lett. 71(3) (Jul. 21, 1997), pp. 353–355, all by A. Nakajima et al. These FETs 60 employ feature sizes as small as 30 nanometers and require much closer alignment between elements than 30 nanometers. Formation of such small feature sizes using electron beam lithography does not presently lend itself to mass production.

These FETs 60 employ a floating island 26 between the gate 62 and the channel 66 to modulate conductivity in the channel 66. In these FETs 60, the island 26 spans the width of the channel 66.

It will be appreciated that other techniques for forming the islands 26 may be employed. For example, shallow implantation of relatively high doses (e.g., ca. 5–50×$10^{14}$/cm$^2$) of silicon or germanium at relatively low energies (e.g., ca. 20 keV) into relatively thin (e.g., ca. 5–20 or more nanometers) silicon dioxide layers, followed by annealing, provides nanocrystals of the implanted species that are insulated from each other and from an underlying silicon region, as described in "Fast and Long Retention-Time Nano-Crystal Memory" by H. Hanafi et al., IEEE Trans. El. Dev., Vol. 43, No. 9 (September 1996), pp. 1553–1558. Performance of memories using islands 26 formed from nanocrystals in proximity to the channel 66 is discussed in "Single Charge and Confinement Effects in Nano-Crystal Memories" by S. Tiwari et al., Appl. Phys. Lett. 69(9) (Aug. 26, 1996), pp. 1232–1234.

Prior art FETs may provide multiple islands 26 between the gate 62 and the channel 66, and are capable of storing multiple electrons 32. As a result, these FETs are analogous to conventional flash memories and are capable of multilevel signal storage and readout. An example of an arrangement for discriminating between multiple signal levels that may represent a stored signal is given in "Novel Level-Identifying Circuit for Multilevel Memories" by D. Montanari et al., IEEE Jour. Sol. St. Cir., Vol. 33, No. 7 (July 1998), pp. 1090–1095.

FETs 60 including one or more islands 26 suitable for capture of electrons 32 thus are able to provide measurable and repeatable changes in their electrical properties in response to capture of the electron or electrons 32 on at least one island 26. Moreover, these FETs 60 provide these changes in a convergent manner, i.e., the changes may be produced by storage of a single electron 32 and storage of that single electron 32 can inhibit storage of another electron 32. In this way, some of the FETs 60 avoid some problems due to number fluctuations in the population of electrons 32 that could otherwise be troublesome for FETs 60 having very small populations of electrons 32.

Additionally, the energy barriers 48, 48' cause the single electron device 20 and the FETs 60 to store trapped electrons 32 for significant periods of time, even in the absence of externally applied electrical power (e.g., voltage sources 34, 64). As a result, a nonvolatile memory function is provided by these devices 20 and FETs 60.

While single electron devices 20 and FETs 60 show great promise as memory cells for very high density memory arrays, fabrication difficulties prevent mass production of memory arrays using these devices 20, 60 as memory cells. Difficulties in regulating the size of the island or islands 26 and the thickness of the surrounding dielectric materials forming the gaps 28, 28' cause problems, particularly with respect to uniformity of device characteristics across many similar devices on a wafer or substrate. Difficulties in realizing the fine line interconnections (e.g., ca. 0.4 micron pitch) and other needed elements also cause poor yields in fabrication of these devices 20, 60.

There is therefore a need for a method for fabricating single electron devices that is robust and that provides reproducible single-electron device characteristics.

SUMMARY OF THE INVENTION

In one aspect, the present invention includes a memory cell having a first electrode coupled to a first location on semiconductor material, a second electrode coupled to a second location disposed away from the first location on the semiconductor material and a plurality of islands of conductive material having a maximum dimension of three nanometers and surrounded by an insulator having a thickness of between five and twenty nanometers. The islands and the insulator are formed in pores extending into the semiconductor material between the first and second electrodes. As a result, electrons may tunnel into or out of the islands with the assistance of externally-applied fields. The capacitance of the islands is small enough that single electrons stored on the islands provide consistent, externally observable changes in the memory cells.

In other aspects, the present invention provides methods for reading data from, writing data to and erasing memory cells capable of storing data by the presence or absence of a single electron in an island of conductive material contained in the memory cells. The reading, writing and erasing operations may be accompanied by a verification process that compensates for stored charge, trap generation and the like that otherwise might obscure desired data.

BRIEF DESCRIPTION OF THE DRAWINGS

FIG. 1A is a simplified schematic diagram of a typical two-terminal single electron device, in accordance with the prior art.

FIG. 1B is a simplified potential energy diagram for the device of FIG. 1A, in accordance with the prior art.

FIG. 1C is a simplified potential energy diagram, illustrating the potential V setting the Fermi level at the left side of the Figure equal to the lowest allowed state of the potential well of FIG. 1B, in accordance with the prior art.

FIG. 1D is a simplified graph of an I-V characteristic for the device of FIG. 1A, in accordance with the prior art.

DETAILED DESCRIPTION OF THE INVENTION

Figure 2:
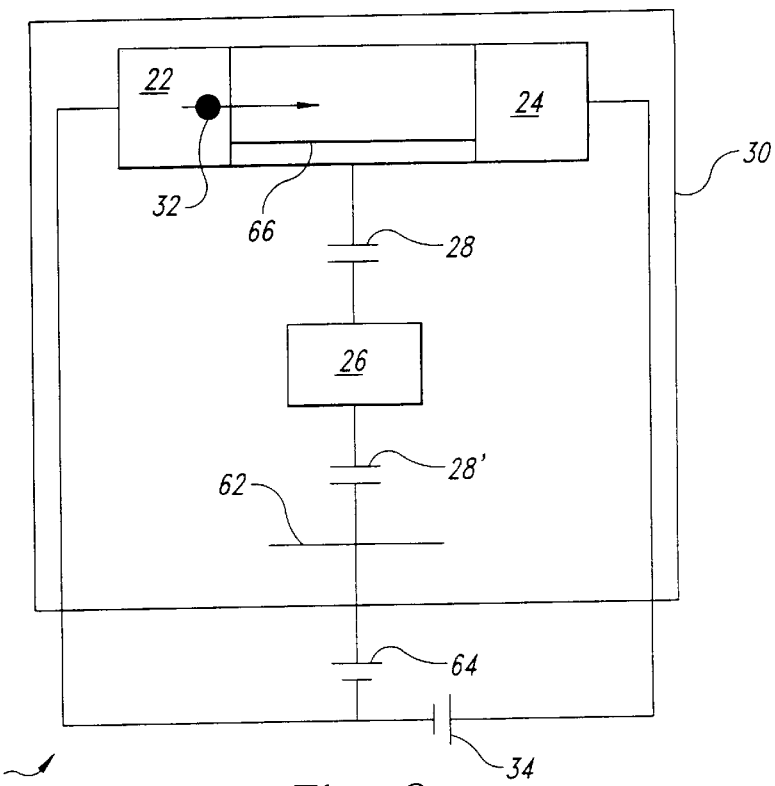
FIG. 2 is a simplified schematic illustration of a typical field effect transistor that includes the island of FIG. 1A for storing one or more electrons, in accordance with the prior art.
Figure 3A:
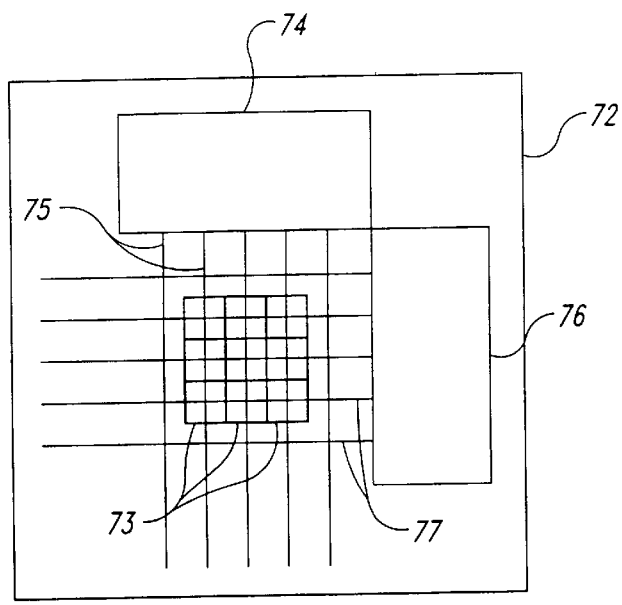
FIG. 3A is a simplified plan view of a memory device including memory cells employing single electron memory devices having electrical characteristics similar to those of the devices of FIGS. 1 and 2, in accordance with embodiments of the present invention.

FIG. 3A is a simplified plan view of a memory device 72 including a memory cell 73 having electrical characteristics similar to those of the devices 20 and 60 of FIGS. 1 and 2, in accordance with embodiments of the present invention. The memory device 72 includes a column addressing circuit 74 coupled to a plurality of column address lines 75, and a row addressing circuit 76 coupled to a plurality of row address lines 77. The memory cell 73 is located at an intersection of a column address line 75 and a row address line 77 and is addressed by activation of the column 75 and row 77 address lines coupled to the memory cell 73, as is discussed below in more detail.

Figure 3B:
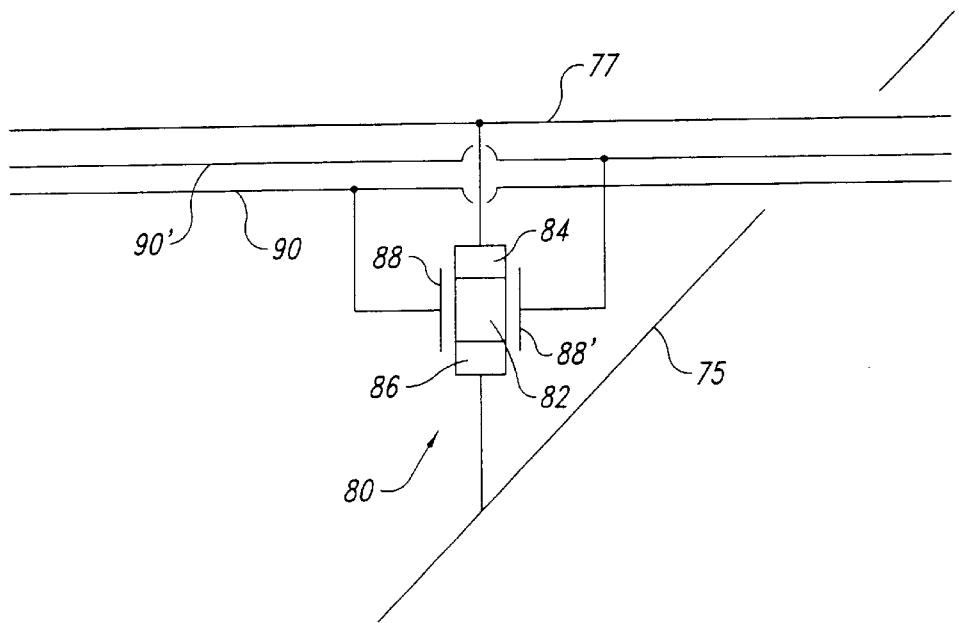
FIG. 3B is a simplified isometric view of a single electron resistor memory device in the memory cell of FIG. 3A, in accordance with embodiments of the present invention.

FIG. 3B is a simplified isometric view of a single electron resistor memory device 80 in the memory cell 73 of FIG. 3A, in accordance with embodiments of the present invention. The device 80 includes a body 82 having first 84 and second 86 electrodes formed at opposing ends. In one embodiment, the first 84 and second 86 electrodes form low resistance contacts to the body 82. In one embodiment, the body 82 includes n-type semiconductor material having a donor concentration of about $10^{15}/cm^3$ or less and the first 84 and second 86 electrodes are N+ ohmic contacts to the body 82. The first electrode 84 is coupled to a row address line 77 and the second electrode 86 is coupled to a column address line 75.

The device 80 also optionally includes one or more gates 88, 88' coupled to one or more erase lines 90, 90' for erasing data stored in the device 80. In one embodiment, the gates 88, 88' are formed from polysilicon using conventional processing techniques.

Figure 3C:
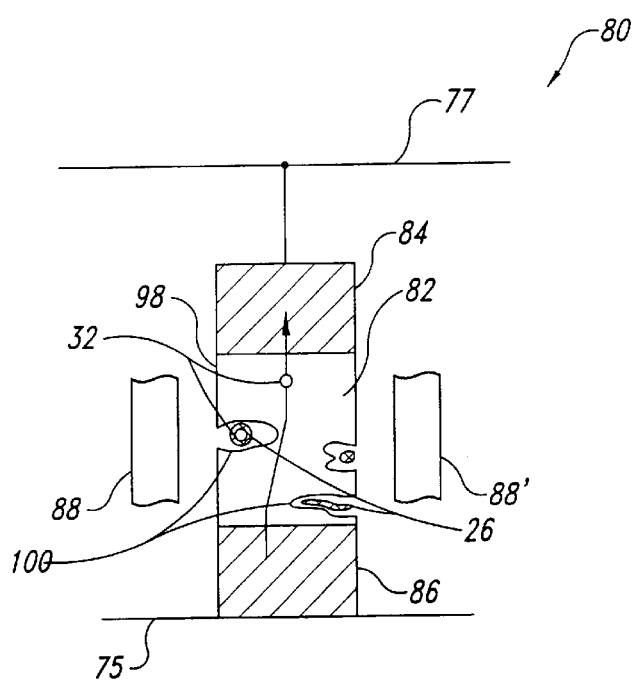
FIG. 3C is a simplified cross-sectional view of the device of FIG. 3B, showing islands included within the semiconductor material of the body, in accordance with embodiments of the present invention.

FIG. 3C is a simplified cross-sectional view of the device 80 of FIG. 3B, showing islands 26 (see FIGS. 1 and 2) included within the semiconductor material 98 forming the body 82 of the device 80, in accordance with embodiments of the present invention. Each island 26 is surrounded by a dielectric 100 that provides the energy barriers 48, 48' (FIGS. 1B and C) associated with the gaps 28, 28', which insulate the island 26 from other islands 26 and from the semiconductor material 98.

The device 80 of FIGS. 3A–C has a first state exhibiting a first current-voltage characteristic when no electrons 32 are stored on the islands 26 within the device 80. The device 80 has a second state exhibiting a second current-voltage characteristic when one or more electrons 32 are stored in one or more islands 26 contained in the body 82 of the device 80. In the second state, less current between the first electrode 84 and the second 86 electrode for a given voltage difference between the first 84 and second 86 electrodes than in the first state, and this difference may be detected by sensing circuitry (not illustrated) coupled to the column 75 or the row 77 address lines. Processes for switching the device 80 between the first and second states by storage and removal of electrons 32 from the island or islands 26 in the body 82 of the device 80 are explained in more detail below.

To store one or more electrons 32 in the body 82 of the device 80, the column address line 75 is coupled to a first voltage (e.g., ground) and the row address line 77 is coupled to a second voltage (e.g., four volts) sufficient to cause single electrons 32 (FIG. 1) to tunnel into and to be stored on one or more of the islands 26 in the body 82 of the device 80, as is explained below in more detail with reference to FIG. 5. As a result, the device 80 changes from the first state to the second state.

To erase information represented by one or more stored electrons 32 stored on the island or islands 26 within the body 82 of the device 80, the row 77 or column 75 (or both) address line is coupled to an electron sink (e.g., ground). The body 82 is depleted of mobile charge carriers by an externally-applied bias, which also tilts the barriers 48, 48' and results in field-assisted tunneling of electrons 32 stored in the potential wells 40 of the islands 26 from the islands 26 into the body 82. In one embodiment, a negative potential is applied to one or more gate electrodes 88, 88' sufficient to completely deplete the semiconductor material 98 forming the body 82 of mobile charge carriers (i.e., electrons 32 or holes) to allow any stored electrons 32 to tunnel out of the island or islands 26. Electrons 32 tunneling out of the islands 26 are removed from the semiconductor material 98 by electrical fields induced by the voltage applied to the gate electrodes 88, 88'. As a result, the device 80 is restored to the first state.

A change in a current I between the first 84 and the second 86 electrode, corresponding to a difference ΔI in the current I between the first and second states, can be estimated as follows. The body 82 of the device 80 has a cross-sectional area A, a length L between the first 84 and second 86 electrodes and a number $n_T$ of electrons 32 trapped on the islands 26. A conductivity σ for the semiconductor material 98, as could be measured between the first 84 and second 86 electrodes, is given by nqμA/L, where μ represents the electron mobility and n represents the number of mobile charge carriers (electrons 32) per cubic centimeter. Assuming that each of the $n_T$ trapped electrons 32 results in one fewer mobile electron 32 per cubic centimeter, the change in current ΔI through the device 80 may be estimated as ΔI=($n_T$/AL)(qμAV/L)=$n_T$qμV/$L^2$. A voltage V of one volt, a mobility μ of 600 $cm^2$/(v-sec) and a length L of one micrometer corresponds to a decrease in current ΔI due to one stored electron 32 of 10 nanoamperes.

In one embodiment, the body 82 of the device 80 may have a length L of about one micrometer ($10^{-4}$ cm) and have a cross-sectional area A of about $10^{-8}$ $cm^2$. A free carrier concentration of $10^{15}$/$cm^3$ or less allows the gates 88, 88' to be able to deplete the semiconductor material 98 with relatively low applied voltages.

Figure 4:
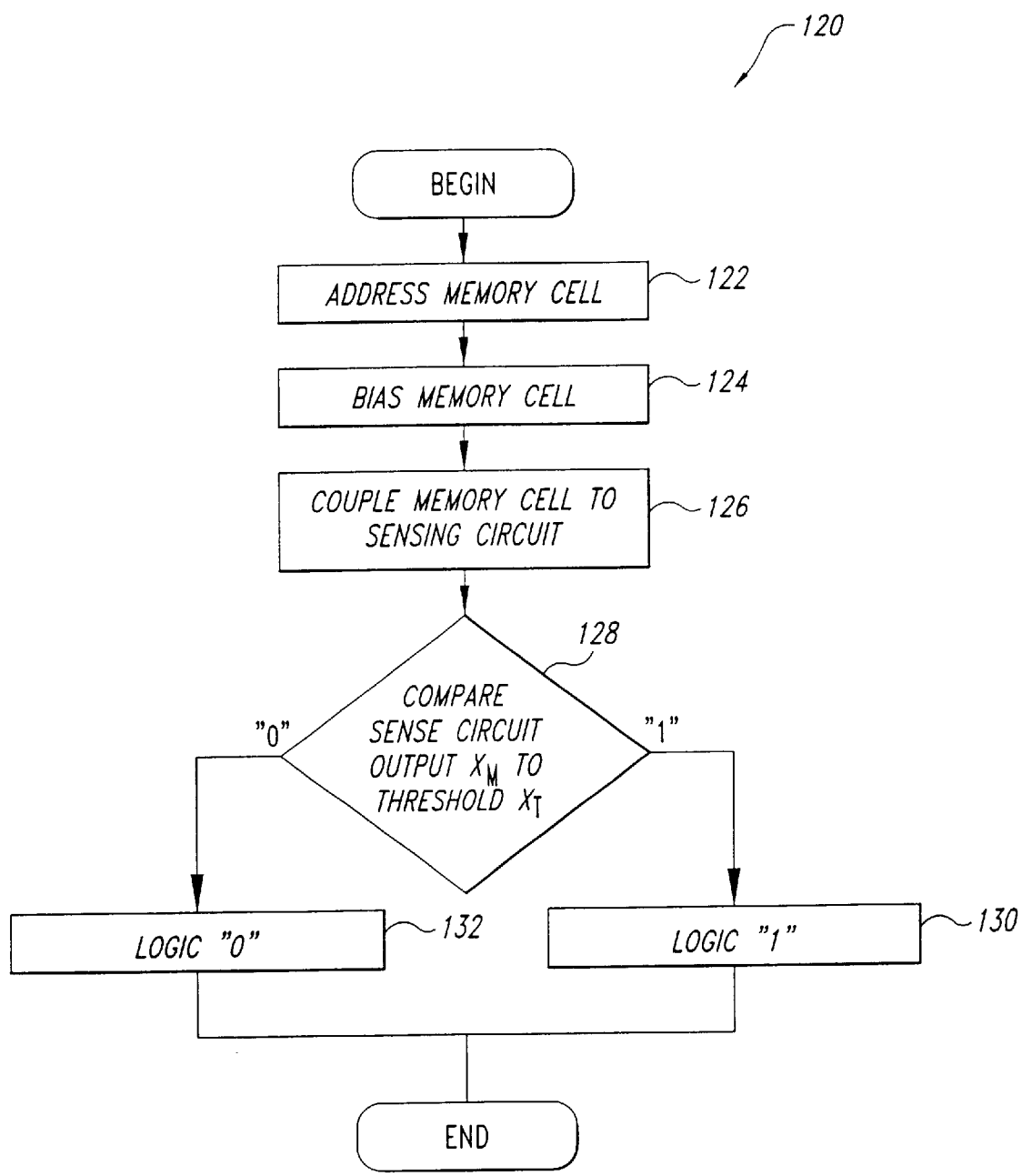
FIG. 4 is a simplified flow chart of a process for reading the memory cell of FIGS. 3A–C, in accordance with embodiments of the present invention.

FIG. 4 is a simplified flow chart of a process 120 for reading the memory cell 73 of FIG. 3A, in accordance with embodiments of the present invention. The process 120 begins in a step 122 by activating one of the column address lines 75 and one of the row address lines 77 of FIGS. 3A–C to address one of the memory cells 73. In a step 124, a bias current $I_B$ or voltage $V_B$ is applied to the addressed memory cell 73, as is discussed below in more detail. In a step 126, the addressed memory cell 73 is coupled to a sensing circuit (not shown). In some embodiments, a query task 128 then compares a measured response $X_M$ to a threshold $X_T$ to determine if a logical "1" or a logical "0" is stored in the memory cell 73 as is described below in more detail.

In one embodiment, when a bias current $I_B$ is supplied from a current source (not shown) to, for example, the first electrode 84 of the addressed memory cell 73, the measured response $X_M$ is a voltage, measured, for example, across the first 84 and second 86 electrodes. When the query task 128 determines that the measured response $X_M$ exceeds the threshold $X_T$, at least one electron 32 is stored in the memory cell 73 and the memory cell 73 is storing a first logical state. When the query task 128 determines that the measured response $X_M$ does not exceed the threshold $X_T$, no electron 32 is stored in the memory cell 73 and the memory cell 73 is storing a second logical state.

Conversely, in another embodiment, when a bias voltage $V_B$ is supplied from a voltage source (not shown) to, for example, one or both of the gates 88, 88' of the addressed memory cell 73, the measured response $X_M$ is a current, measured, for example, at the first electrode 84. When the query task 128 determines that the measured response $X_M$ exceeds the threshold $X_T$, no electron 32 is stored in the memory cell 73 and the memory cell 73 is in the second logical state. When the query task 128 determines that the measured response $X_M$ does not exceed the threshold $X_T$, at least one electron 32 is stored in the memory cell 73 and the memory cell 73 is in the first logical state.

When the query task 128 determines that the memory cell 73 is in the first logical state, the comparison circuit indicates that the memory cell 73 is in the first logical state, e.g., that a logical "1" is stored in the memory cell 73, in a step 130. When the query task 128 determines that the memory cell 73 is in the second logical state, the comparison circuit indicates that a logical "0" is stored in the memory cell 73 in a step 132. The process 120 ends following either step 130 or step 132.

In another embodiment, the query task 128 discriminates between a plurality of different logical values or states that may be stored in the memory cell 73 by comparing the measured response $X_M$ to a plurality of thresholds $X_{Ti}$. An example of an arrangement for discriminating between multiple signal levels that may represent a stored signal is given in "Novel Level-Identifying Circuit for Multilevel Memories" by D. Montanari et al., IEEE Jour. Sol. St. Cir., Vol. 33, No. 7 (July 1998), pp. 1090–1095. An example of a circuit and method for programming, reading and erasing multiple single electron differences in the FETs 80 of FIGS. 3A–C is given in "Multi-State Flash Memory Cell and Method for Programming Single Electron Differences" by L. Forbes, U.S. Pat. No. 5,740,104. After the query task 128 determines the correct logical value for the data stored in the memory cell 73, the data comparison circuit indicates the correct logical value in steps 130–132 and the process 120 ends.

Figure 5:
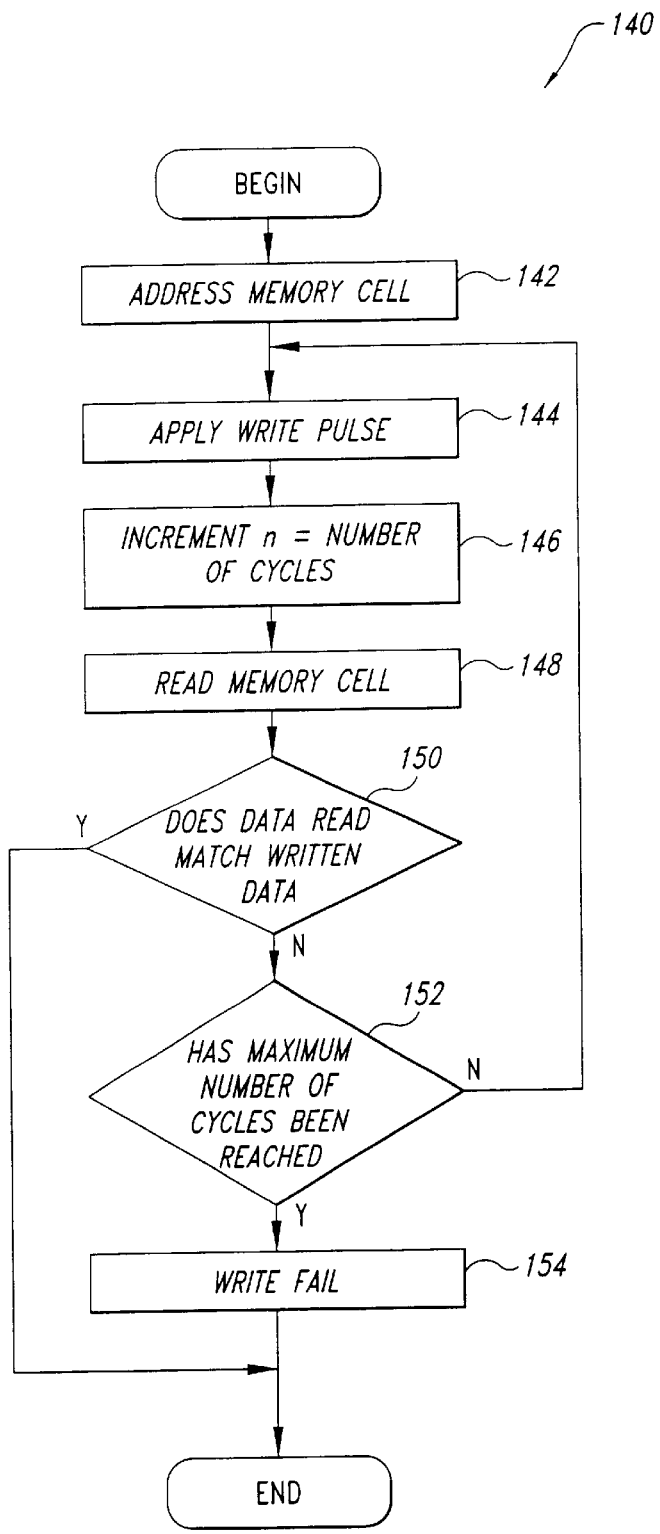
FIGS. 5 and 6 are simplified flow charts for processes for writing data to the memory cell of FIGS. 3A–C and for erasing data stored in the memory cell, respectively, in accordance with embodiments of the present invention.
Figure 6:
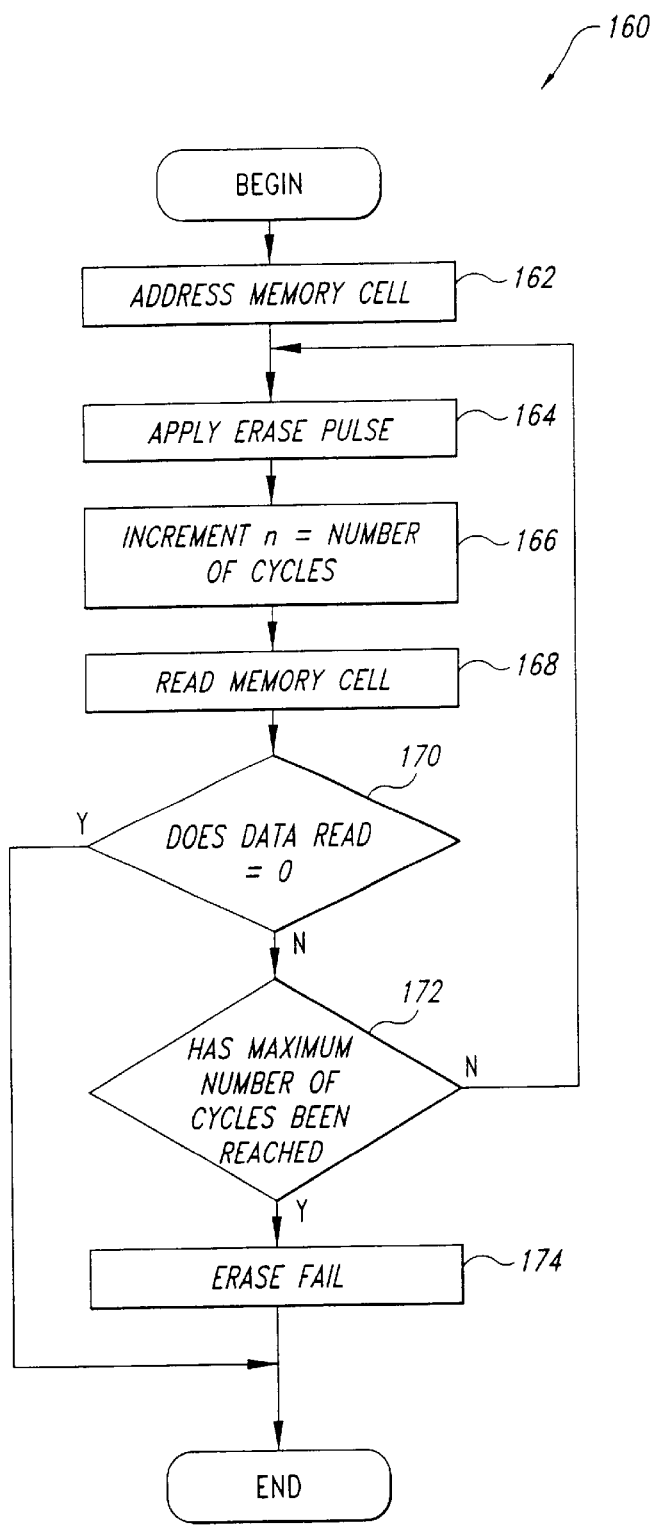

FIGS. 5 and 6 are simplified flow charts for processes 140 and 160 for writing data to the memory cell 73 of FIG. 3A and for erasing data stored in the memory cell 73, respectively, in accordance with embodiments of the present invention. The processes 140 and 160 both use a verification process similar to a conventional verification process used with flash memories to compensate for variations in memory cell characteristics from one memory cell 73 to another, as is described in "Verify: Key to the Stable Single-Electron-Memory Operation" by T. Ishii et al. (1997 IEDM), pp. 171–174.

With reference now to FIG. 5, the write process 140 begins in a step 142 by activating one of the column address lines 75 and one of the row address lines 77 of FIGS. 3A–C to address one of the memory cells 73. In a step 144, a write pulse, which may be either a current $I_W$ or a voltage $V_W$ pulse, is applied to the addressed memory cell 73. In some embodiments, the step 144 is used to write a binary value to the memory cell 73. In other embodiments, the step 144 is used to write one of a plurality of possible values or data entries to the memory cell 73 by injecting a controlled number of electrons 32 into the islands 26 of the memory cell 73.

In a step 146, an index variable n, corresponding to a number of write cycles applied to this memory cell during this write process 140, is incremented. In a step 148, the memory cell 73 is read by sampling a voltage or current associated with the memory cell 73, i.e., the process 120 of FIG. 4. A query task 150 then compares the read data to the data written to the memory cell 73 in the step 144.

When the query task 150 determines that the read data and the write data agree, the process 140 ends. When the query task 150 determines that the read data and the write data do not agree, control passes to a query task 152 to determine if a maximum number of cycles N has been reached (i.e., is n≧N?). The maximum number of cycles N is despite differences in programming time between memory cells 73, without wasting excessive amounts of time in attempts to program defective memory cells 73. When the query task 152 determines that the maximum number of cycles N has not been reached, control passes to the step 144, and steps 144–150 or 152 repeat. When the query task 152 determines that the maximum number of cycles N has been reached, a step 154 records that a write failure has occurred and the process 140 ends.

In some embodiments, the record of a write failure that is generated in the step 154 may be used to construct a conventional memory map describing addresses of defective memory cells 73. Memory maps are used in order to avoid writing data to, or attempting to write data to, or reading data from, memory cells 73 that are defective. In some embodiments, the record of a write failure that is generated in the step 154 may be used to replace defective memory cells 73 with memory cells 73 that are known to be working properly, as is conventional in fabrication and repair of memory devices such as dynamic random access memories.

In the step 144, where a write pulse is applied to the memory cell 73, a finite number of electrons 32 are injected into the island or islands 26. A probability of write failure is finite and nonzero because injection of electrons 32 into the potential wells 40 (FIG. 1C) is essentially stochastic. For example, a failure probability of 0.1% is unacceptable in modem memory devices. Additionally, characteristics of the memory cell 73 may change with time, due to generation of new trapping centers or by trapping of charge in or near the memory cell 73.

Reading data from the memory cell 73 after a write pulse has been applied to the memory cell allows determination that a write failure has occurred. By making the write pulses $I_W$ or $V_W$ longer as n increases, the probability of trapping the desired number of electrons 32 increases substantially and may approach unity. In one embodiment, a width $W_W$ of the write pulses $I_W$ or $V_W$ depends geometrically on n, e.g., $W_W(n)$ $2^n$, $n \in \{I\}$. In another embodiment, the amplitude of the write pulses depends arithmetically on n, e.g., $V_W(n)$ $V_W(o)(1+n/M)$, $n \in \{I\}$, where $V_W(o)$ represents an initial value and M represents a proportionality constant.

With reference now to FIG. 6, the erase process 160 begins in a step 162 by activating one or more of the column address lines 75 and one or more of the row address lines 77 of FIGS. 3A–C to address one or more of the memory cells 73. In one embodiment, the step 162 selects a group of memory cells 73, which may be a subset of the memory cells on one memory device 72, may be all of the memory cells 73 on a memory device 72 or may include memory cells 73 from more than one memory device 72. In a step 164, an erase pulse, which may be either a current $I_E$ or voltage $V_E$, is applied to the addressed memory cell 73. In one embodiment, the erase pulse is applied to one or both of the erase gates 88, 88', with one or both of the electrodes 84, 86 coupled to a suitable electron sink. In a step 166, an index variable n, corresponding to a number of erase cycles applied to this memory cell 80 during this erase process 160, is incremented. In a step 168, the memory cell 73 is read by sampling a voltage or current associated with the memory cell 73. A query task 170 then compares the read data to an expected value (e.g., corresponding to an absence of stored electrons 32) to determine if the contents of the memory cell 73 were erased in the step 164.

When the query task 170 determines that the contents of the memory cell 73 were erased, the process 160 ends. When the query task 170 determines that the contents of the memory cell 73 were not erased, control passes to a query task 172 to determine if a maximum number of cycles N has been reached (ie., is $n \geq N$?). As with the write process 140 of FIG. 5, N is chosen to balance differences in erase time from one memory cell 73 to another memory cell 73 without spending excessive time to erase defective memory cells 73. When the query task 172 determines that the maximum number of cycles N has not been reached, control passes back to the step 164, and steps 164–170 or 172 repeat. In accordance with embodiments of the invention, the erase pulses $V_E$ may be varied with n as described above for the write pulses $I_W$ or $V_W$ in connection with the process 140 of FIG. 5. When the query task 172 determines that the maximum number of cycles N has been reached, a step 174 records that an erase failure has occurred The process then 160 ends.

In one embodiment, individual memory cells 73 are erased as needed for storage of new data. In another embodiment, all of the memory cells 73 in a group or in an entire memory device 72 are erased en masse, by addressing a group of memory cells 73 in the step 162 and application of the erase pulses in the step 164 to all of the memory cells 73 in the group or in the memory device 72 simultaneously. The steps 166–174 are then carried out for each memory cell 73 individually, with a step of addressing the individual memory cells 73 being carried out prior to the step 166 of incrementing the index variable n. In another embodiment, the memory cells are erased en masse, however, the steps 166–174 are carried out as steps 146–154 of the verified write process 140 of FIG. 5.

An advantage of en masse erasure is that the erase process 160 is slow, typically requiring milliseconds. Erasure of the entire memory device 72 one memory cell 73 at a time takes much longer than erasure of the entire memory device 72 en masse, and this is more exaggerated as the number of memory cells 73 in the memory device 72 increases.

Several factors affect storage times $\tau_S$, also known as latency, for memory cells 73 incorporating islands 26 for storage of one or more electrons 32. In general, $T_s$ $e^{(\Delta E/kT)}$ $e^{(d/d_o)}$, where $\Delta E$ represents the energy level difference between the energy barriers 48, 48' and the lowest allowed state in the island 26 and $d/d_o$ represents the relative thickness of the gaps 28, 28'. Larger $\Delta E$ values or large $d/d_o$ values provide for longer storage times but also require higher write and erase pulse magnitudes and greater pulse durations. Additionally, $\Delta E$ is a function of the material forming the island 26 and the material forming the gaps 28, 28'. The energy level difference $\Delta E$ may be estimated by subtracting the electron affinity $\chi_{INS}$ for the material forming the gaps 28, 28' from the electron affinity $\chi_{ISL}$ for the material making up the island 26 and then adding the electron charging energy $q^2/2C$, i.e., $\Delta E = \chi_{ISL} - \chi_{INS} + q^2/2C$. Representative values for electron affinities $\chi$ for several materials are summarized below in Table I. Measured or achieved electron affinities $\chi$ depend strongly on surface treatment and surface contamination and may vary from the values given in Table I.

TABLE I

Electron affinities $\chi$ for selected materials.

| $\chi$ (eV) | Material | Use |
|---|---|---|
| 4.05 | Si | Islands |
| 3.6/3.7* | SiC | Islands |
| 1.4** | C (diamond) | Islands |
| 0.9–4.05 | Silicon oxycarbide (projected) | Islands |
| 0.9 | $SiO_2$ | Gaps |

*depending on surface treatment.
**diamond can manifest different values, including negative values.

Figure 7:
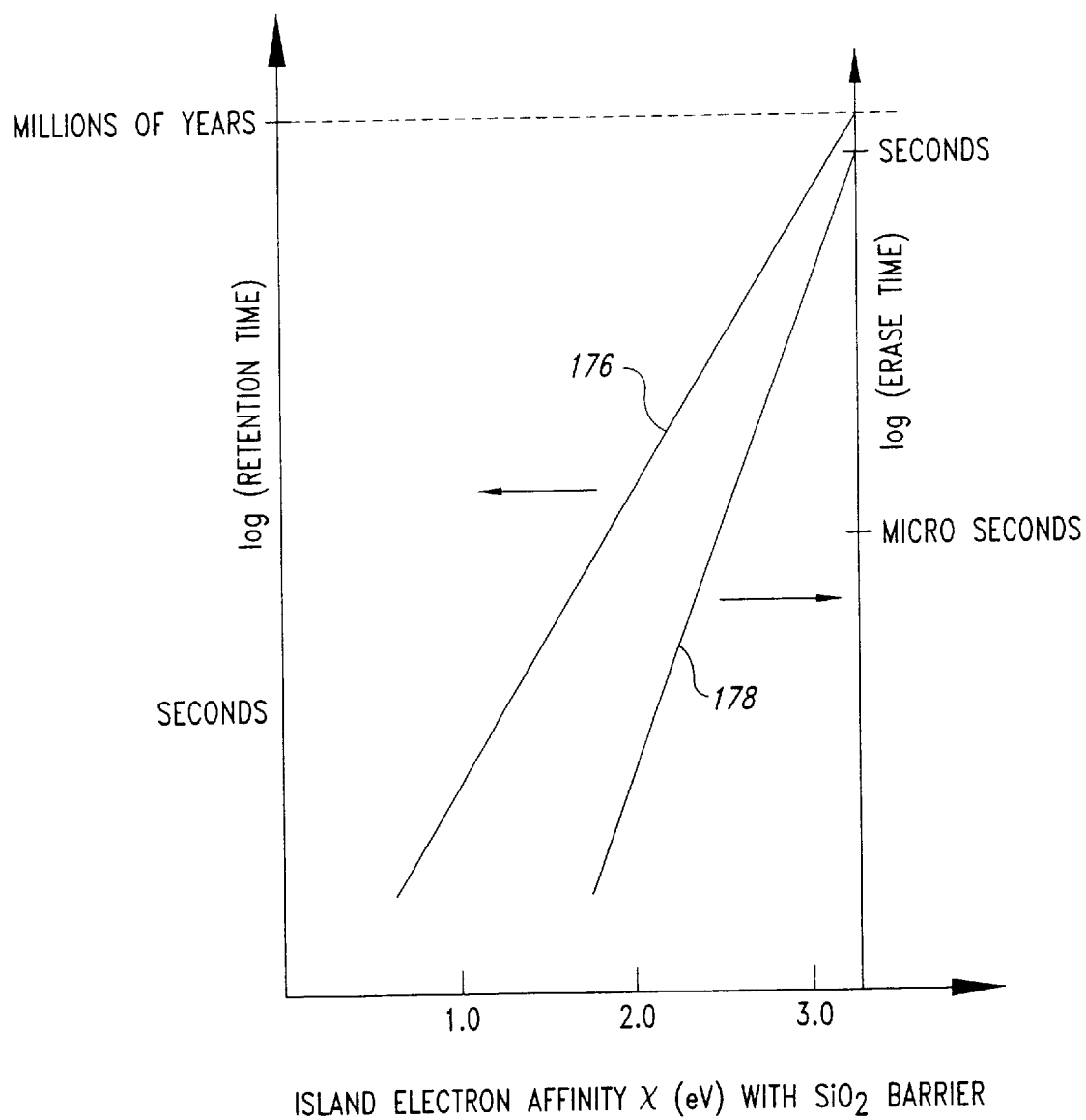
FIG. 7 is a graph representing storage and erase time estimates for various energy barriers, in accordance with embodiments of the present invention.

FIG. 7 is a graph representing estimated storage 176 and erase 178 time estimates for various island electron affinities $\chi_{ISL}$ together with $SiO_2$ barriers in accordance with embodiments of the present invention. The left ordinate corresponds to a logarithm of retention time 176 at constant temperature, while the right ordinate corresponds to a logarithm of erase time 178 at constant erase voltage. Erase times 178 for the memory device 72 are determined by the height of the energy barrier 48, 48' (FIGS. 1B and C) surrounding the island 26. Lower energy barriers 48, 48' require lower voltage, shorter erase pulses because lower energy barriers 48, 48' provide shorter tunneling distances and much higher tunneling probabilities. Short erase times 178 are desirable for some applications of electronically-erasable memories such as the memory device 72.

Lower barriers 48, 48' also result in shorter retention times 176 due to thermal activation of electrons 32 over or through the energy barriers 48, 48'. The islands 26 may be formed from silicon, from microcrystalline diamond-like films of $Si_{(1-x)}C_x$, with the composition ratio, x, ranging from 0.5 to one, or from silicon oxycarbide compounds, to provide electron affinities $\chi$ ranging between about 4.05 eV and 0.9 eV or less (see Table I), corresponding to energy barriers $\Delta E$ ranging from about 3.95 to about 0 eV (ignoring the charging voltage). By changing the composition of the islands 26 and the thickness of the surrounding insulator, and thus the height of the energy barriers 48, 48', charge retention times 176 can be changed from seconds, characteristic of DRAMs, to years, characteristic of hard disk drives. As a result, the memory device 72 can either be made to emulate a DRAM or a hard disk drive by varying the composition of the islands 26. One device type can then perform all memory functions.

FIG. 7 illustrates that storage 176 and erase 178 times vary exponentially with the height of the energy barriers 48, 48'. Presently, memories using polycrystalline silicon floating gates embedded in silicon dioxide are estimated to have charge retention times 176 of millions of years at 85° C. because the energy barriers 48, 48' are large (3.2 eV), resulting in erase times 178 in the millisecond range. The high electric fields required for erasure as a result of the large energy barriers 48, 48' may result in reliability problems or, in the worst case, lead to breakdown and catastrophic failure of the device 72. An island 26 may be composed of a material of lower or adjusted energy barrier height, such as diamond-like compounds of silicon, carbon and oxygen, to provide desired energy barriers 48, 48'. As a result, an acceptable retention time 176 can be established, whether seconds or years, by varying the relative concentrations of Si, C and O, thereby varying the electron affinity $\chi$ for the islands 26. This then determines the height of the energy barriers 48, 48' and therefore, in part, the erase time 178 for a particular erase voltage.

FIG. 7 shows the concepts involved using rough order-of-magnitude estimates of the variations of storage and erasure times with barrier height. The same device structure can be used either as replacements for DRAMS or as replacements for hard disk drives. Only the composition of the island 26 needs to be changed in order to change the retention time and the erasure characteristics. This may be done on one integrated circuit so that radically different types of memory functions are realized on one integrated circuit.

Figure 8:
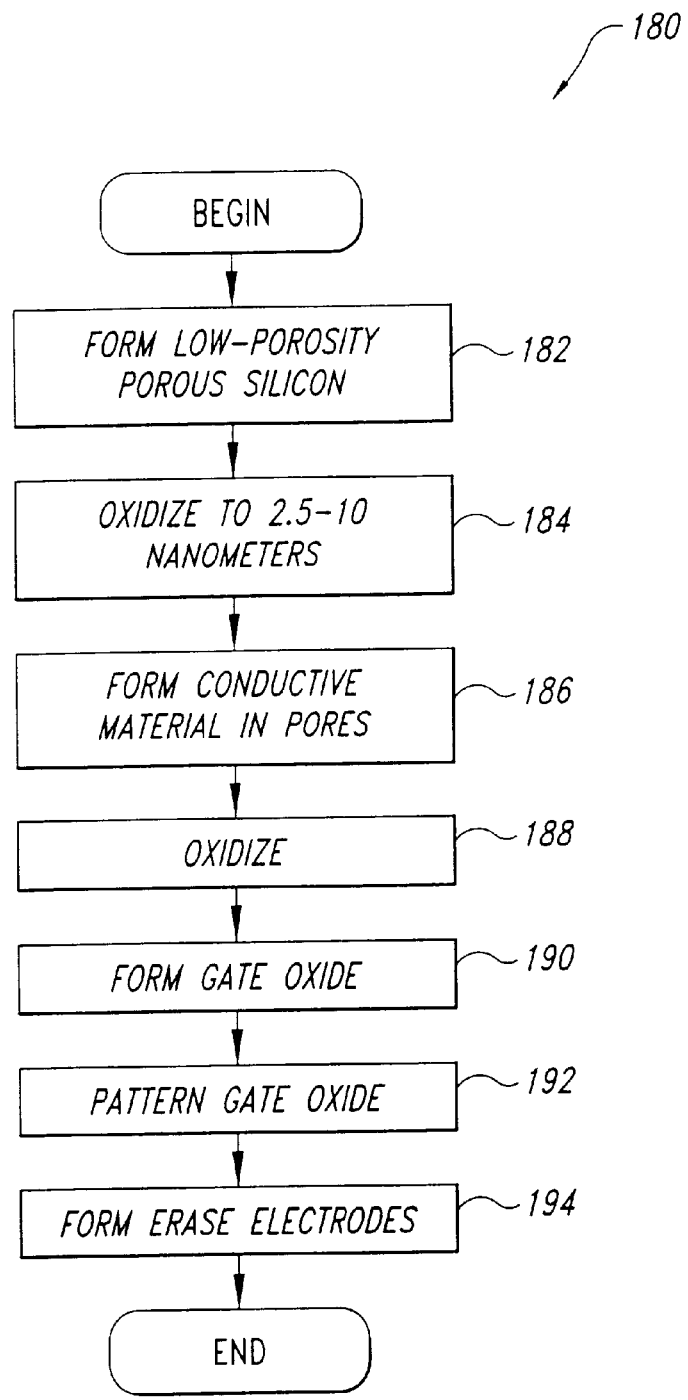
FIG. 8 is a simplified flowchart of a process for forming the islands of FIGS. 1 and 2, in accordance with embodiments of the present invention.

FIG. 8 is a simplified flowchart of a process 180 for forming the islands 26 of FIGS. 1 and 2, and FIGS. 9A–9E are simplified cross-sectional views of the islands 26 as they are being formed using the process 180 of FIG. 8, in accordance with embodiments of the present invention. The process 180 (FIG. 8) begins in a step 182 with formation of voids or pores 202 (FIG. 9A) in a suitable silicon substrate or layer 98 (FIGS. 3C and 9A–9E). In one embodiment, the voids or pores 202 are formed by processes similar to those described in "Formation Mechanism of Porous Silicon Layers Obtained by Anodization of Monocrystalline n-type Silicon in HF Solutions" by V. Dubin, Surface Science 274 (1992), pp. 82–92. In one embodiment, a current density of between 5 and 40 mA/cm² is employed together with 12–24% HF. In general, increasing $N_D$ (silicon donor concentration), HF concentration or anodization current density provides larger pores 202 and may lead to reentrant pores 202. Pores 202 are readily and uniformly formed to have the desired characteristics when using simple and easily controlled processes.

Figure 9A:
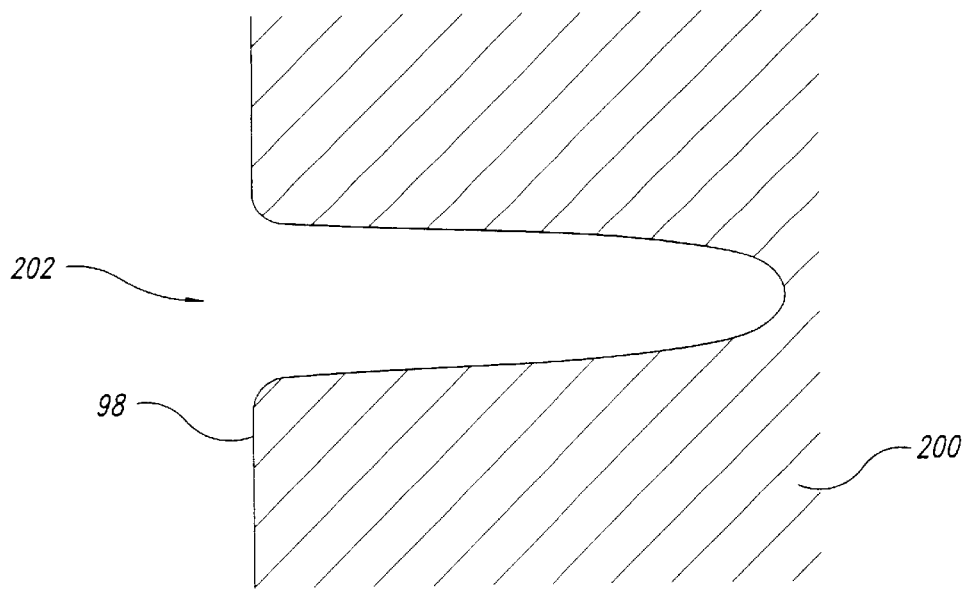
FIGS. 9A–9E are simplified cross-sectional views of the islands as they are being formed using the process of FIG. 8, in accordance with embodiments of the present invention.
Figure 9B:
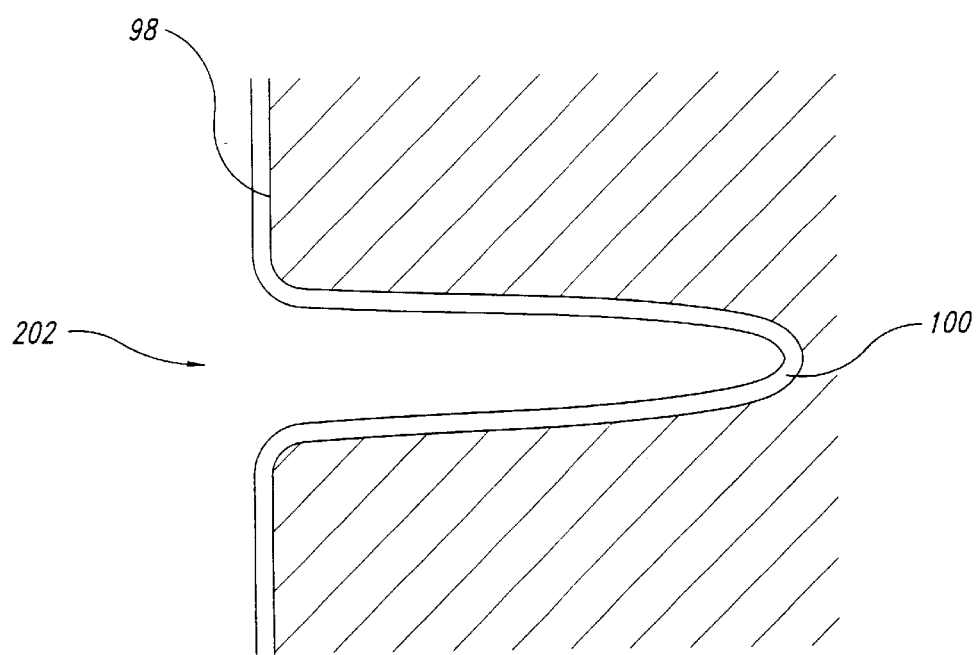
Figure 9C:
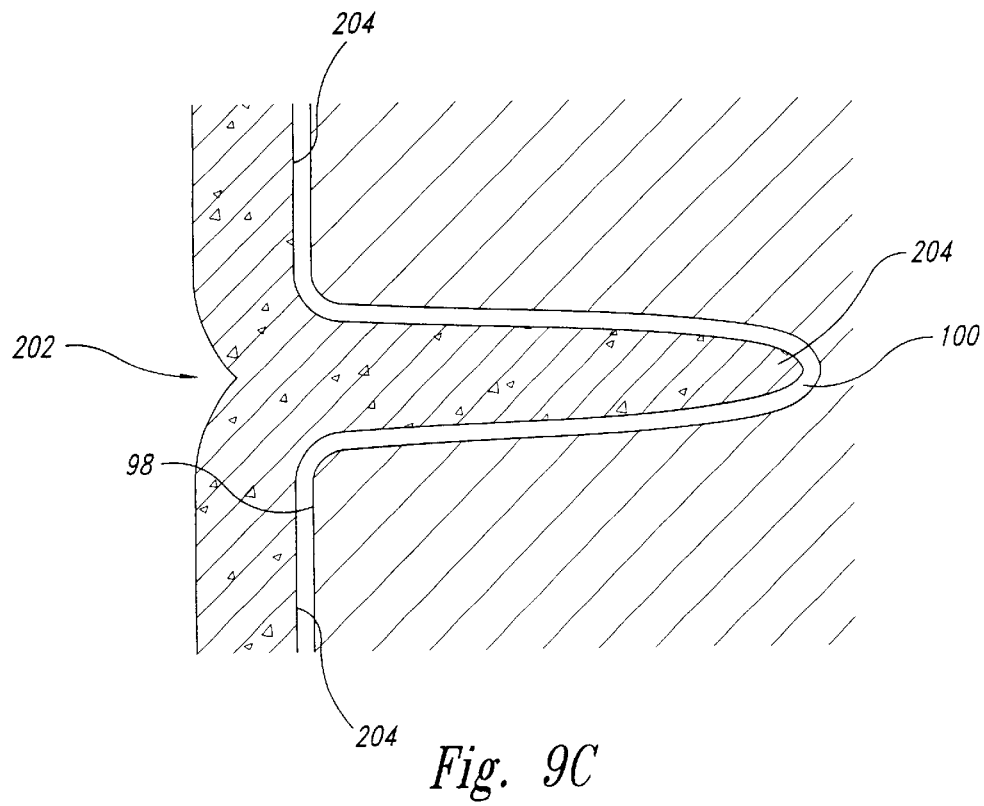

In a step 184, the silicon 98 including interiors of the pores 202 is oxidized to provide a thin oxide layer 100 (FIG. 9B). In one embodiment, the silicon 98 is oxidized to provide the oxide layer 100 to have a thickness of between 2.5 and ten nanometers. The oxidation step 184 may be carried out using conventional oxidation techniques. In one embodiment, an inductively-coupled oxygen-argon mixed plasma is employed for oxidizing the silicon 98, as described in "Low-Temperature Si Oxidation Using Inductively Coupled Oxygen-Argon Mixed Plasma" by M. Tabakomori et al., Jap. Jour. Appl. Phys., Part 1, Vol. 36, No. 9A (September 1997), pp. 5409–5415. In another embodiment, electron cyclotron resonance nitrous oxide plasma is employed for oxidizing the silicon 98, as described in "Oxidation of Silicon Using Electron Cyclotron Resonance Nitrous Oxide Plasma and its Application to Polycrystalline Silicon Thin Film Transistors," J. Lee et al., Jour. Electrochem. Soc., Vol. 144, No. 9 (September 1997), pp. 3283–3287 and "Highly Reliable Polysilicon Oxide Grown by Electron Cyclotron Resonance Nitrous Oxide Plasma" by N. Lee et al., IEEE El. Dev. Lett., Vol. 18, No. 10 (October 1997), pp. 486–488.

In a step 186, a conductive material 204 (FIG. 9C) is formed over the surface of the silicon 98 and in the pores 202. In some embodiments, semiconductor material 204 is deposited over the surface of the silicon 98 and in the pores 202.

Examples of materials 204 that may be used in accordance with embodiments of the invention include the materials listed in Table I above. The material 204 within the pores 202 forms the islands 26 and is chosen to have an electron affinity $\chi$ that, together with the thickness $d/d_o$ and the electron affinity $\chi$ of the insulator 100 filling the gaps 28, 28' (FIGS. 1A and 2), provides storage times in a range of from hours to days or longer, together with practical erase parameters.

In some embodiments, silicon oxycarbide is employed as the material 204 in the step 186. A process for forming thin microcrystalline films of silicon oxycarbide is described in "Transport Properties of Doped Silicon Oxycarbide Microcrystalline Films Produced by Spatial Separation Techniques" by R. Martins et al., Solar Energy Materials and Solar Cells 41/42 (1996), pp. 493–517. A diluent/reaction gas (e.g., hydrogen) is introduced directly into a region where plasma ignition takes place. The mixed gases containing the species to be deposited are introduced close to the region where the growth process takes place, which is often a substrate heater. A bias grid is located between the plasma ignition and the growth regions, spatially separating the plasma and growth regions.

Deposition parameters for producing doped microcrystalline $Si_x:C_y:O_z:H$ films may be defined by determining the hydrogen dilution rate and power density that lead to microcrystallization of the grown film 204. The power density is typically less than 150 milliwatts per cm³ for hydrogen dilution rates of 90%+, when the substrate temperature is about 250° C. and the gas flow is about 150 sccm. The composition of the films may then be varied by changing the partial pressure of oxygen during film growth to provide the desired characteristics.

In some embodiments, SiC is employed as the material 204 in the step 186. SiC films may be fabricated by chemical vapor deposition, sputtering, laser ablation, evaporation, molecular beam epitaxy or ion implantation. Vacuum annealing of silicon substrates is another method that may be used to provide SiC layers having thicknesses ranging from 20 to 30 nanometers, as described in "Localized Epitaxial Growth of Hexagonal and Cubic SiC Films on Si by Vacuum Annealing" by Luo et al., Appl. Phys. Lett. 69(7) (1996), pp. 916–918. Prior to vacuum annealing, the substrates are degreased with acetone and isopropyl alcohol in an ultrasonic bath for fifteen minutes, followed by cleaning in a solution of $H_2SO_4:H_2O_2$ (3:1) for fifteen minutes. A five minute rinse in deionized water then precedes etching with a 5% HF solution. The substrates are blown dry using dry nitrogen and placed in a vacuum chamber. The chamber is pumped to a base pressure of $1-2\times10^{-6}$ Torr. The substrate is heated to 750 to 800° C. for half an hour to grow the microcrystalline SiC film.

In some embodiments, silicon is employed as the material 204 in the step 186. Methods for depositing high quality polycrystalline films of silicon on silicon dioxide substrates are given in "Growth of Polycrystalline Silicon at low Temperature on Hydrogenated Microcrystalline Silicon ($\mu$c-Si:H) Seed Layer" by Parks et al., Proceedings of the 1997 MRS Spring Symposium, Vol. 467 (1997), pp. 403408, "Novel Plasma Control Method in PECVD for Preparing Microcrystalline Silicon" by Nishimiya et al., Proceedings of the 1997 MRS Spring Symposium, Vol. 467 (1997), pp. 397–401 and "Low Temperature (450° C.) Poly-Si Thin Film Deposition on $SiO_2$ and Glass Using a Microcrystalline-Si Seed Layer" by D. M. Wolfe et al., Proceedings of the 1997 MRS Spring Symposium, Vol. 472 (1997), pp. 427–432. A process providing grain sizes of about 4 nm is described in "Amorphous and Microcrystalline Silicon Deposited by Low-Power Electron-Cyclotron Resonance Plasma-Enhanced Chemical-Vapor Deposition" by J. P. Conde et al., Jap. Jour. Of Appl. Phys., Part I, Vol. 36, No. 1A (June 1997), pp. 3849. Deposition conditions favoring small grain sizes for microcrystalline silicon include high hydrogen dilution, low temperature, low deposition pressure and low source-to-substrate separation.

Figure 9D:
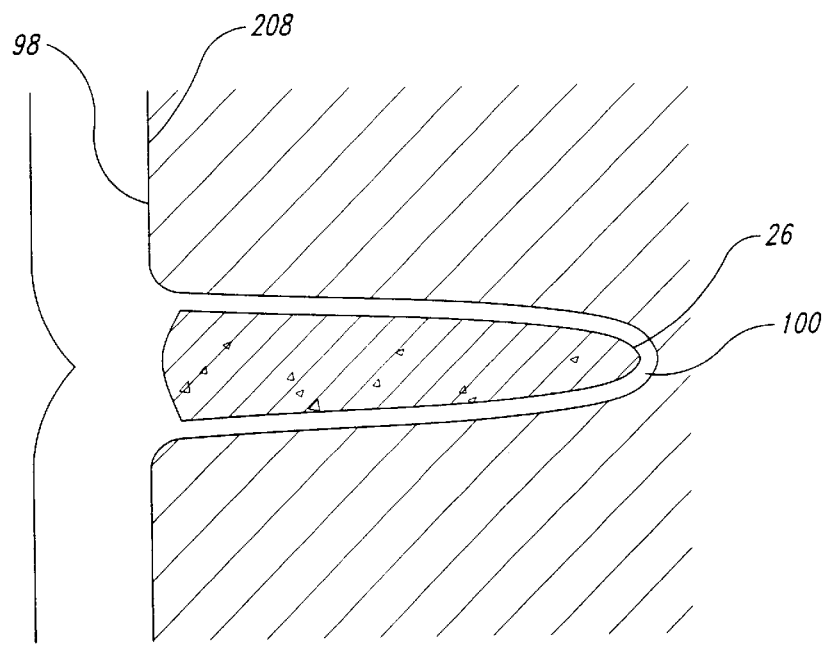
Figure 9E:
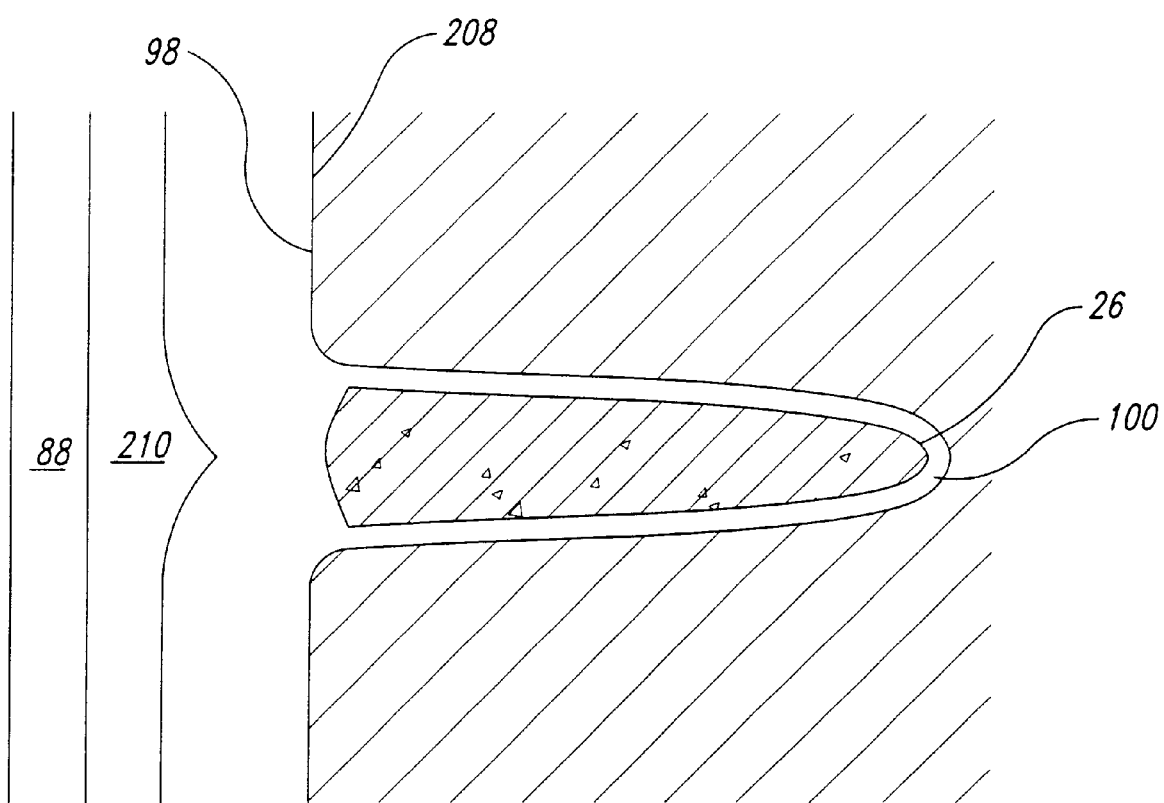

In a step 188, the portion of the materials 204 deposited in the step 186 that are located on the silicon surface are effectively removed. In one embodiment, in the step 188, the portion of the materials 204 deposited in the step 186 that are located on the surface of the silicon body 98 are oxidized to provide a structure as illustrated in FIG. 9D. The step 188 proceeds until the material 204 on the surface is completely oxidized but does not proceed for long enough to oxidize all of the material 204 in the pores 202. As a result, isolated islands 26 of semiconductor material 204 surrounded by silicon dioxide 100 are formed in the pores 202 in the single crystal silicon 98 forming the body 82 of the device 80 (FIGS. 3A–C).

Significantly, the materials listed in Table I for use in the islands 26 can be oxidized to form silicon dioxide 208 or to form a volatile gas ($CO_2$). As a result, the islands 26 may be isolated from each other by a simple oxidation process that may not require a photolithographic step.

In a step 190, an optional gate oxide 210 (FIG. 9E) is formed on the silicon surface and on top of the material 204 deposited in the pores 202. In a step 192, the gate oxide is patterned using conventional techniques. The process 180 then ends and further fabrication is carried out using conventional processing. An advantage of the process 180 is that it does not rely on very-fine-line lithography for formation of the islands 26.

Approaches using such fine line lithography are described in "A Room-Temperature Silicon Single-Electron Metal-Oxide-Semiconductor Memory With Nanoscale Floating-Gate and Ultranarrow Channel" by L. Guo et al., Appl. Phys. Lett. 70(7) (Feb. 17, 1997), pp. 850–852 and "Fabrication And Characterization of Room Temperature Silicon Single Electron Memory" by L. Guo et al., J. Vac. Sci. Technol. B 15(6) (November/December 1997), pp. 2840–2843. These devices were fabricated using e-beam lithography and incorporate features having widths as narrow as 25 nanometers. Similarly, devices described in "Room Temperature Operation of Si Single-Electron-Memory with Self-Aligned Floating Dot Gate" (IEDM 1996), pp. 952–954, Appl. Phys. Lett. 70(13) (Mar. 31, 1997), pp. 1742–1744 and "Si Single Electron Tunneling Transistor With Nanoscale Floating Dot Stacked on a Coulomb Island by Self-Aligned Process," Appl. Phys. Lett. 71(3) (Jul. 21, 1997), pp. 353–355, all by A. Nakajima et al., employ feature sizes as small as 30 nanometers and require much closer alignment between elements than 30 nanometers. Formation of such small feature sizes using electron beam lithography does not presently lend itself to mass production.

It will be appreciated that other techniques for forming the islands 26 (FIG. 3C) may be employed. For example, shallow implantation of relatively high doses (e.g., ca. $5-50\times10^{14}$ $cm^2$) of silicon or germanium at relatively low energies (e.g., ca. 20 keV) into relatively thin (e.g., ca. 5–20 or more nanometers) silicon dioxide layers, followed by annealing, provides nanocrystals of the implanted species that are insulated from each other and from an underlying silicon region, as described in "Fast and Long Retention-Time Nano-Crystal Memory" by H. Hanafi et al., EEE Trans. El. Dev., Vol. 43, No. 9 (September 1996), pp. 1553–1558. Performance of memories using nanocrystals in proximity to a channel is discussed in "Single Charge and Confinement Effects in Nano-Crystal Memories" by S. Tiwari et al., Appl. Phys. Lett. 69(9) (Aug. 26, 1996), pp. 1232–1234.

Figure 10:
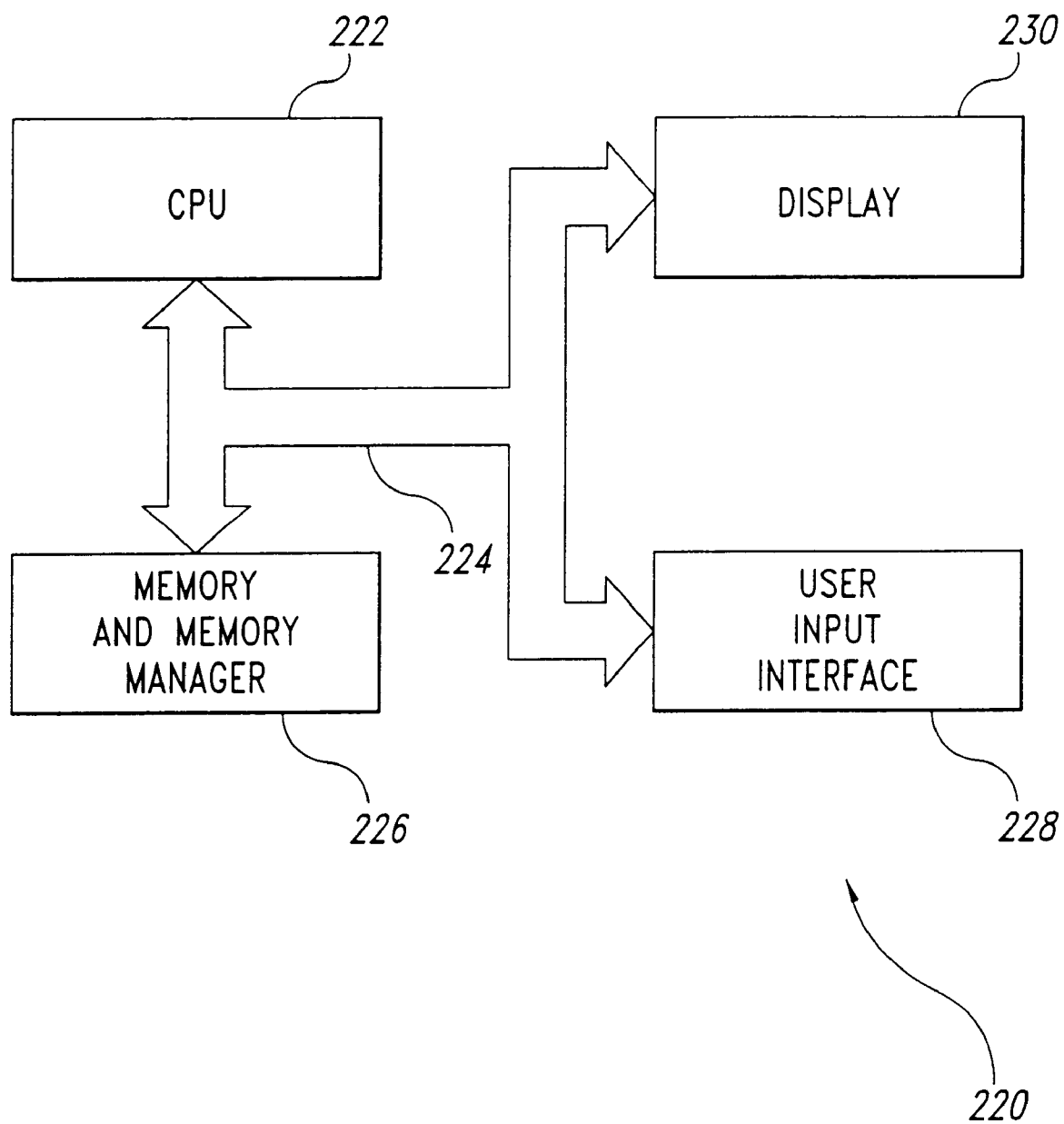
FIG. 10 is a simplified block diagram of a computer system including the memory device of FIGS. 3A–C, in accordance with embodiments of the present invention.

FIG. 10 is a simplified block diagram of a portion of a computer system 220 including the memory device 80 of FIGS. 3A–C, in accordance with embodiments of the present invention. The computer system 220 includes a central processing unit 222 for performing various computing functions, such as executing specific software to perform specific calculations or tasks. The central processing unit 222 is coupled via a bus 224 to a memory 226, a user input interface 228, such as a keyboard or a mouse, and a display 230. The memory 226 may or may not include a memory management module (not illustrated) and does include ROM for storing instructions providing an operating system and read-write memory for temporary storage of data. The processor 222 operates on data from the memory 226 in response to input data from the user input interface 228 and displays results on the display 230. The processor 222 also stores data in the read-write portion of the memory 226. The integrated circuit 72 (FIG. 3A) is particularly useful when it is a memory integrated circuit in the read-write memory portion of the memory 226, because it may then allow the memory 226 to provide increased information storage capacity and/or density.

The embodiments of the present invention provide a compact, sensitive memory cell and permit very high storage capacity memories to be fabricated. Additionally, the inventive memory cell does not require high resolution lithography for fabrication of the islands that store charge.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A method of forming a memory device comprising:

forming a first array of memory cells having a first latency on a substrate; and forming a second array of memory cells having a second latency different than the first latency on the substrate.

2. The method of claim 1 wherein forming a first array of memory cells comprises:

forming a first group of bodies of semiconductor material;

forming a first contact at a first end of each first body;

forming a second contact at a second end of each first body, the second end distant from the first end;

anodizing the first bodies to form first pores extending into the first bodies;

coating interiors of the first pores with a first dielectric having a thickness of less than ten nanometers;

forming a first conductive material in the interiors of the first pores; and coating exposed portions of the first conductive material with a second dielectric.

3. The method of claim 2 wherein forming a second array of memory cells comprises:

forming a second group of bodies of semiconductor material;

forming a first contact at a first end of each second body;

forming a second contact at a second end of each second body, the second end distant from the first end;

anodizing the second bodies to form second pores extending into the second bodies between the first and second contacts;

coating interiors of the second pores with a third dielectric having a thickness of less than ten nanometers;

forming a second conductive material different than the first conductive material in the interiors of the second pores; and coating exposed portions of the second conductive material with a fourth dielectric.

* * * * *

UNITED STATES PATENT AND TRADEMARK OFFICE
CERTIFICATE OF CORRECTION

PATENT NO.   : 6,607,956 B2
DATED        : August 19, 2003
INVENTOR(S)  : Kie Y. Ahn and Leonard Forbes It is certified that error appears in the above-identified patent and that said Letters Patent is hereby corrected as shown below:

Title page,
Item [56], References Cited, OTHER PUBLICATIONS, "Hussein I. Hanafi" reference, "Hanafi.," should read -- Hanafi, --
"Donato Montanari" reference, *"Journal of SolidState"* should read -- *Journal of Solid State* --

Column 1,
Line 65, "Device And Method For Fabricating The" should read -- Device and Method for Fabricating the --

Column 3,
Line 28, "Memory With Nanoscale" should read -- Memory with Nanoscale --
Line 30, "And Characterization" should read -- and Characterization --

Column 4,
Line 32, "island or islands 26" should read -- island or islands 26 --

Column 6,
Line 32, "In the second state, less" should read -- In the second state, there is less --

Column 9,
Line 29, "$W_w(n)\ 2^n$, $n \in \{I\}$." should read -- $W_w(n) \propto 2^n$, $n \in \{I\}$. --
Lines 30-31, "$V_w(n)\ V_w(o)(1+n/M)$, $n \in \{I\}$," should read -- $V_w(n) \propto V_w(o)(1+n/M)$, $n \in \{I\}$, --

Column 10,
Line 29, "$\tau s\ e^{(\Delta E/kT)}$" should read -- $\tau s \propto e^{(\Delta E/kT)}$ --
Line 42, "$\Delta E = \lambda_{ISL} - \lambda_{INS} + q^2/2C$." should read -- $\Delta E = \chi_{ISL} - \chi_{INS} + q^2/2C$. --

Column 13,
Line 27, "at low" should read -- at Low --
Line 30, "pp.403408," should read -- pp. 403-408, --
Line 41, "Jour. Of Appl." should read -- Jour. of Appl. --
Line 42, "pp. 3849." should read -- pp. 38-49. --

UNITED STATES PATENT AND TRADEMARK OFFICE
CERTIFICATE OF CORRECTION

PATENT NO. : 6,607,956 B2
DATED : August 19, 2003
INVENTOR(S) : Kie Y. Ahn and Leonard Forbes It is certified that error appears in the above-identified patent and that said Letters Patent is hereby corrected as shown below:

<u>Column 14,</u>
Line 8, "Memory With Nanoscale" should read -- Memory with Nanoscale --
Line 11, "And Characterization" should read -- and Characterization --
Line 37, "et al., EEE" should read -- et al., IEEE --

Signed and Sealed this

Twenty-eighth Day of September, 2004

JON W. DUDAS
*Director of the United States Patent and Trademark Office*